(12) United States Patent
Chen et al.

(10) Patent No.: US 12,347,749 B2
(45) Date of Patent: *Jul. 1, 2025

(54) SEMICONDUCTOR PACKAGES

(71) Applicant: Taiwan Semiconductor Manufacturing Co., Ltd., Hsinchu (TW)

(72) Inventors: Wei-Yu Chen, New Taipei (TW); An-Jhih Su, Taoyuan (TW); Der-Chyang Yeh, Hsinchu (TW); Li-Hsien Huang, Zhubei (TW); Ming Shih Yeh, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/342,246

(22) Filed: Jun. 27, 2023

(65) Prior Publication Data

US 2023/0335471 A1    Oct. 19, 2023

Related U.S. Application Data

(60) Division of application No. 17/373,063, filed on Jul. 12, 2021, now Pat. No. 11,728,249, which is a
(Continued)

(51) Int. Cl.
*H01L 23/485* (2006.01)
*H01L 21/48* (2006.01)
(Continued)

(52) U.S. Cl.
CPC ........ *H01L 23/485* (2013.01); *H01L 21/4857* (2013.01); *H01L 21/4867* (2013.01);
(Continued)

(58) Field of Classification Search
None
See application file for complete search history.

(56) References Cited

U.S. PATENT DOCUMENTS 6,251,797 B1    6/2001 Nishimura
8,361,842 B2    1/2013 Yu et al.
(Continued)

FOREIGN PATENT DOCUMENTS

CN    105990272 A    10/2016
JP    2010010194 A    1/2010
(Continued)

*Primary Examiner* — Erik Kielin
(74) *Attorney, Agent, or Firm* — Slater Matsil, LLP

(57) ABSTRACT

In an embodiment, a device includes: an integrated circuit die; a first dielectric layer over the integrated circuit die; a first metallization pattern extending through the first dielectric layer to electrically connect to the integrated circuit die; a second dielectric layer over the first metallization pattern; an under bump metallurgy extending through the second dielectric layer; a third dielectric layer over the second dielectric layer and portions of the under bump metallurgy; a conductive ring sealing an interface of the third dielectric layer and the under bump metallurgy; and a conductive connector extending through the center of the conductive ring, the conductive connector electrically connected to the under bump metallurgy.

20 Claims, 23 Drawing Sheets

Related U.S. Application Data continuation of application No. 16/588,345, filed on Sep. 30, 2019, now Pat. No. 11,062,978, which is a division of application No. 15/907,474, filed on Feb. 28, 2018, now Pat. No. 10,529,650.

(60) Provisional application No. 62/586,431, filed on Nov. 15, 2017.

(51) Int. Cl.

| | | |
|---|---|---|
| *H01L 21/56* | (2006.01) | |
| *H01L 21/683* | (2006.01) | |
| *H01L 23/00* | (2006.01) | |
| *H01L 23/31* | (2006.01) | |
| *H01L 23/498* | (2006.01) | |
| *H01L 23/522* | (2006.01) | |
| *H01L 23/528* | (2006.01) | |
| *H01L 23/538* | (2006.01) | |
| *H01L 25/00* | (2006.01) | |
| *H01L 25/10* | (2006.01) | |

(52) U.S. Cl.
CPC ........ *H01L 21/568* (2013.01); *H01L 21/6835* (2013.01); *H01L 23/5226* (2013.01); *H01L 23/528* (2013.01); *H01L 23/5389* (2013.01); *H01L 25/105* (2013.01); *H01L 25/50* (2013.01); *H01L 23/3128* (2013.01); *H01L 23/49816* (2013.01); *H01L 24/05* (2013.01); *H01L 24/13* (2013.01); *H01L 2221/68345* (2013.01); *H01L 2221/68359* (2013.01); *H01L 2224/022* (2013.01); *H01L 2224/04105* (2013.01); *H01L 2224/0508* (2013.01); *H01L 2224/05624* (2013.01); *H01L 2224/12105* (2013.01); *H01L 2224/13147* (2013.01); *H01L 2224/214* (2013.01); *H01L 2224/32145* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/92244* (2013.01); *H01L 2224/97* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/15311* (2013.01)

(56) References Cited

U.S. PATENT DOCUMENTS

| | | |
|---|---|---|
| 8,575,493 B1 | 11/2013 | Xu et al. |
| 8,680,647 B2 | 3/2014 | Yu et al. |
| 8,703,542 B2 | 4/2014 | Lin et al. |
| 8,759,964 B2 | 6/2014 | Pu et al. |
| 8,778,738 B1 | 7/2014 | Lin et al. |
| 8,785,299 B2 | 7/2014 | Mao et al. |
| 8,803,306 B1 | 8/2014 | Yu et al. |
| 8,809,996 B2 | 8/2014 | Chen et al. |
| 8,829,676 B2 | 9/2014 | Yu et al. |
| 8,877,554 B2 | 11/2014 | Tsai et al. |
| 9,159,686 B2 | 10/2015 | Chen et al. |
| 10,032,734 B2 | 7/2018 | Huang et al. |
| 10,074,617 B2 | 9/2018 | Jeng et al. |
| 10,529,650 B2 * | 1/2020 | Chen .................. H01L 23/5226 |
| 11,062,978 B2 | 7/2021 | Chen et al. |
| 2004/0126269 A1 | 7/2004 | Nozawa et al. |
| 2005/0006790 A1 | 1/2005 | Huang |
| 2006/0252249 A1 | 11/2006 | Hsu et al. |
| 2007/0087544 A1 | 4/2007 | Chang et al. |
| 2009/0032941 A1 * | 2/2009 | McLellan ............... H01L 23/50 |
| | | 257/737 |
| 2009/0091027 A1 | 4/2009 | Fan |
| 2011/0291288 A1 | 12/2011 | Wu et al. |
| 2012/0217640 A1 * | 8/2012 | Choi ....................... H01L 24/97 |
| | | 257/751 |
| 2013/0026468 A1 | 1/2013 | Yoshimuta et al. |
| 2013/0062760 A1 | 3/2013 | Hung et al. |
| 2013/0062761 A1 | 3/2013 | Lin et al. |
| 2013/0168848 A1 | 7/2013 | Lin et al. |
| 2013/0307140 A1 | 11/2013 | Huang et al. |
| 2014/0077361 A1 * | 3/2014 | Lin ..................... H01L 23/5389 |
| | | 257/737 |
| 2014/0097532 A1 | 4/2014 | Chiang et al. |
| 2014/0159251 A1 | 6/2014 | Marimuthu et al. |
| 2014/0203429 A1 | 7/2014 | Yu et al. |
| 2014/0225222 A1 | 8/2014 | Yu et al. |
| 2014/0252646 A1 | 9/2014 | Hung et al. |
| 2014/0264930 A1 | 9/2014 | Yu et al. |
| 2015/0014851 A1 | 1/2015 | Lu et al. |
| 2015/0028471 A1 * | 1/2015 | Lin ......................... H01L 24/96 |
| | | 257/737 |
| 2015/0255406 A1 | 9/2015 | Miao et al. |
| 2016/0079190 A1 | 3/2016 | Yu et al. |
| 2016/0099222 A1 | 4/2016 | Shim et al. |
| 2016/0240391 A1 | 8/2016 | Chen et al. |
| 2016/0276237 A1 | 9/2016 | Lin et al. |
| 2016/0276284 A1 | 9/2016 | Chen et al. |
| 2017/0005052 A1 * | 1/2017 | Chen ................ H01L 23/49816 |
| 2017/0141055 A1 | 5/2017 | Liu et al. |
| 2017/0170128 A1 | 6/2017 | Chen et al. |

FOREIGN PATENT DOCUMENTS

| | | |
|---|---|---|
| KR | 20090082691 A | 7/2009 |
| KR | 20130118635 A | 10/2013 |
| KR | 20160031947 A | 3/2016 |
| KR | 20160111308 A | 9/2016 |
| TW | 201332073 A | 8/2013 |
| TW | I567900 B | 1/2017 |
| TW | I579966 B | 4/2017 |
| TW | I596701 B | 8/2017 |

* cited by examiner

SEMICONDUCTOR PACKAGES

PRIORITY CLAIM AND CROSS-REFERENCE

This application is a division of U.S. patent application Ser. No. 17/373,063, filed on Jul. 12, 2021, entitled "Semiconductor Package and Method," which is a continuation of U.S. patent application Ser. No. 16/588,345, filed on Sep. 30, 2019, entitled "Semiconductor Package and Method," now U.S. Pat. No. 11,062,978 issued on Jul. 13, 2021, which is a division of U.S. patent application Ser. No. 15/907,474, filed on Feb. 28, 2018, entitled "Semiconductor Package and Method," now U.S. Pat. No. 10,529,650 issued on Jan. 7, 2020, which claims the benefit of U.S. Provisional Application No. 62/586,431, filed on Nov. 15, 2017, which applications are hereby incorporated herein by reference in their entirety.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
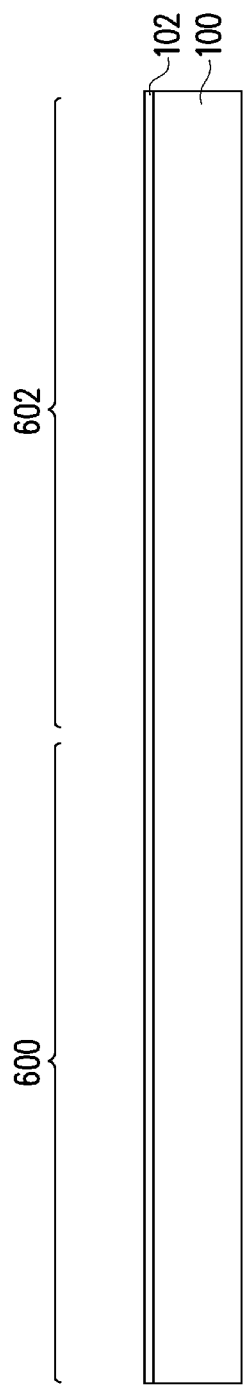
FIGS. 1 through 19 illustrate cross-sectional views of intermediate steps during a process for forming device packages, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a dielectric layer is formed on an under bump metallurgy (UBM) of a redistribution structure. Openings are formed in the dielectric layer, exposing the UBM. A conductive paste is formed at an interface of the dielectric layer and the UBM, and then cured. Flux is formed on the UBM, and a conductive connector (e.g., solder) is formed on the flux. During reflow of the conductive connector, the conductive paste prevents the flux from entering the interface of the dielectric layer and the UBM. Adhesion between the dielectric layer and UBM may thus be improved, thereby improving the mechanical reliability of the redistribution structure.

FIGS. 1 through 19 illustrate cross-sectional views of intermediate steps during a process for forming first packages 200, in accordance with some embodiments. A first package region 600 and a second package region 602 are illustrated, and a first package 200 is formed in each package region. The first packages 200 may also be referred to as integrated fan-out (InFO) packages.

In FIG. 1, a carrier substrate too is provided, and a release layer 102 is formed on the carrier substrate too. The carrier substrate too may be a glass carrier substrate, a ceramic carrier substrate, or the like. The carrier substrate too may be a wafer, such that multiple packages can be formed on the carrier substrate too simultaneously. The release layer 102 may be formed of a polymer-based material, which may be removed along with the carrier substrate too from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate too, or may be the like. The top surface of the release layer 102 may be leveled and may have a high degree of coplanarity.

Figure 2:
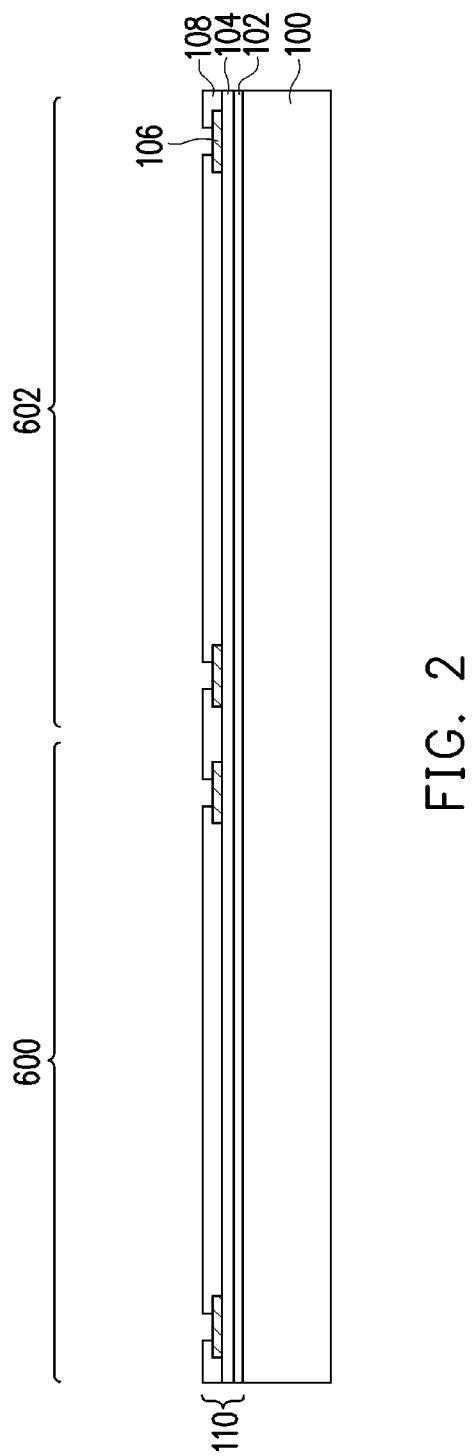

In FIG. 2, a dielectric layer 104, a metallization pattern 106 (sometimes referred to as redistribution layers or redistribution lines), and a dielectric layer 108 are formed. The dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, chemical vapor deposition (CVD), laminating, the like, or a combination thereof.

The metallization pattern 106 is formed on the dielectric layer 104. As an example to form metallization pattern 106, a seed layer (not shown) is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 106. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 106.

The dielectric layer 108 is formed on the metallization pattern 106 and the dielectric layer 104. In some embodiments, the dielectric layer 108 is formed of a polymer, which may be a photo-sensitive material such as PBO, polyimide, BCB, or the like, that may be patterned using a lithography mask. In other embodiments, the dielectric layer 108 is formed of a nitride such as silicon nitride; an oxide such as silicon oxide, PSG, BSG, BPSG; or the like. The dielectric layer 108 may be formed by spin coating, lamination, CVD, the like, or a combination thereof. The dielectric layer 108 is then patterned to form openings to expose portions of the metallization pattern 106. The patterning may be by an acceptable process, such as by exposing the dielectric layer 108 to light when the dielectric layer 108 is a photo-sensitive material or by etching using, for example, an anisotropic etch.

The dielectric layers 104 and 108 and the metallization pattern 106 may be referred to as a back-side redistribution structure 110. In the embodiment shown, the back-side redistribution structure 110 includes the two dielectric layers 104 and 108 and one metallization pattern 106. In other embodiments, the back-side redistribution structure no can include any number of dielectric layers, metallization patterns, and conductive vias. One or more additional metallization pattern and dielectric layer may be formed in the back-side redistribution structure 110 by repeating the processes for forming the metallization pattern 106 and dielectric layer 108. Conductive vias (not shown) may be formed during the formation of a metallization pattern by forming the seed layer and conductive material of the metallization pattern in the opening of the underlying dielectric layer. The conductive vias may therefore interconnect and electrically couple the various metallization patterns.

Figure 3:
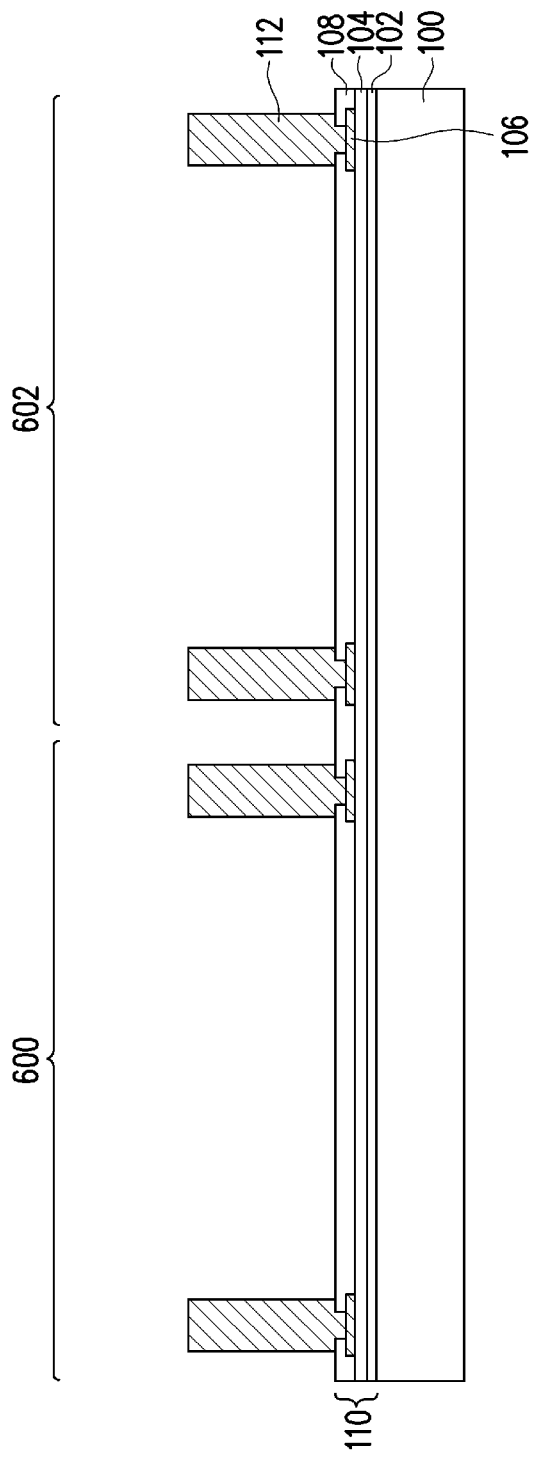

In FIG. 3, through vias 112 are formed. As an example to form the through vias 112, a seed layer is formed over the back-side redistribution structure no, e.g., the dielectric layer 108 and the exposed portions of the metallization pattern 106 as illustrated. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the through vias 112.

Figure 4:
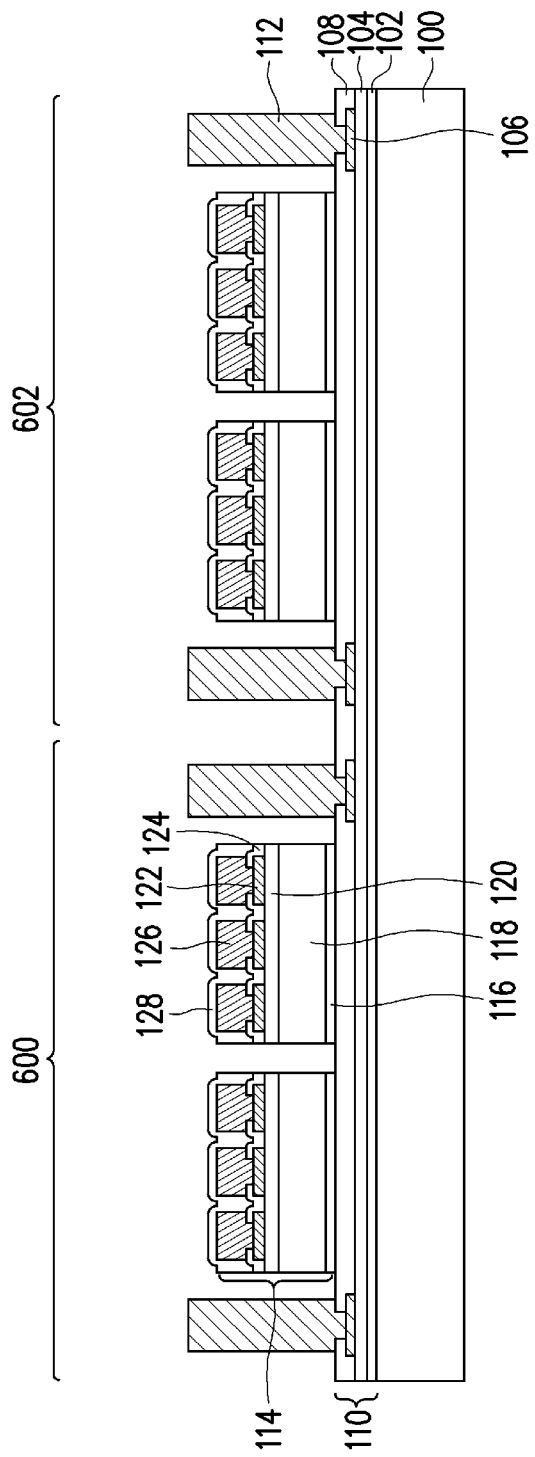

In FIG. 4, integrated circuit dies 114 are adhered to the dielectric layer 108 by an adhesive 116. Although two integrated circuit dies 114 are illustrated as being adhered in each of the first package region 600 and the second package region 602, it should be appreciated that more or less integrated circuit dies 114 may be adhered in each package region. For example, only one integrated circuit die 114 may be adhered in each region. The integrated circuit dies 114 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 114 may be different sizes (e.g., different heights and/or surface areas), and in other embodiments, the integrated circuit dies 114 may be the same size (e.g., same heights and/or surface areas).

Before being adhered to the dielectric layer 108, the integrated circuit dies 114 may be processed according to applicable manufacturing processes to form integrated circuits in the integrated circuit dies 114. For example, the integrated circuit dies 114 each include a semiconductor substrate 118, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

The integrated circuit dies 114 further comprise pads 122, such as aluminum pads, to which external connections are made. The pads 122 are on what may be referred to as respective active sides of the integrated circuit dies 114. Passivation films 124 are on the integrated circuit dies 114 and on portions of the pads 122. Openings are through the passivation films 124 to the pads 122. Die connectors 126, such as conductive pillars (for example, comprising a metal such as copper), are in the openings through the passivation films 124 and are mechanically and electrically coupled to the respective pads 122. The die connectors 126 may be formed by, for example, plating, or the like. The die connectors 126 electrically couple the respective integrated circuits of the integrated circuit dies 114.

A dielectric material 128 is on the active sides of the integrated circuit dies 114, such as on the passivation films 124 and the die connectors 126. The dielectric material 128 laterally encapsulates the die connectors 126, and the dielectric material 128 is laterally coterminous with the respective integrated circuit dies 114. The dielectric material 128 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

The adhesive 116 is on back-sides of the integrated circuit dies 114 and adheres the integrated circuit dies 114 to the back-side redistribution structure no, such as the dielectric layer 108. The adhesive 116 may be any suitable adhesive, epoxy, die attach film (DAF), or the like. The adhesive 116 may be applied to a back-side of the integrated circuit dies 114, such as to a back-side of the respective semiconductor wafer or may be applied over the surface of the carrier substrate too. The integrated circuit dies 114 may be singulated, such as by sawing or dicing, and adhered to the dielectric layer 108 by the adhesive 116 using, for example, a pick-and-place tool.

Figure 5:
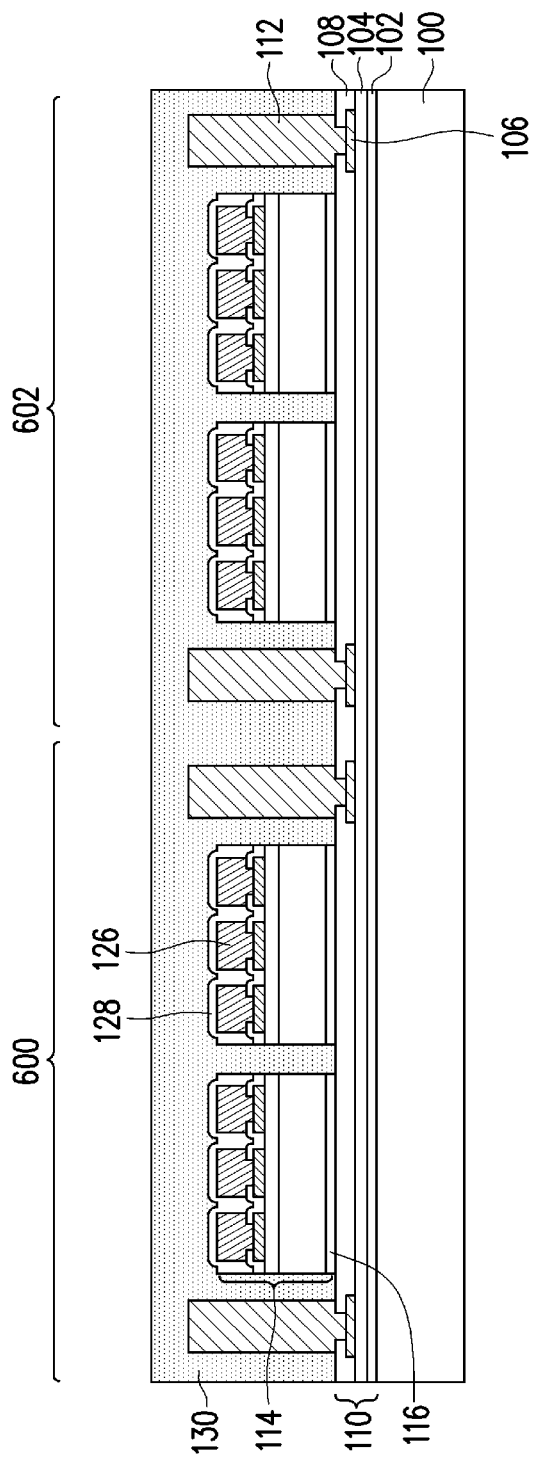

In FIG. 5, an encapsulant 130 is formed on the various components. The encapsulant 130 may be a molding compound, epoxy, or the like, and may be applied by compression molding, transfer molding, or the like. The encapsulant 130 may be formed over the carrier substrate too such that the through vias 112 and/or the die connectors 126 of the integrated circuit dies 114 are buried or covered. The encapsulant 130 is then cured.

Figure 6:
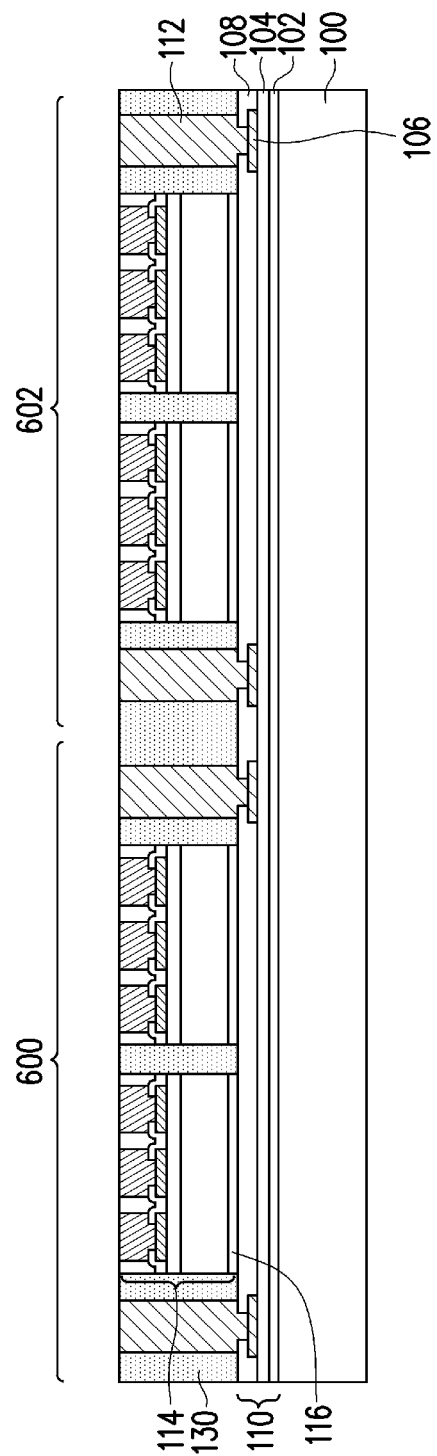

In FIG. 6, a planarization process is performed on the encapsulant 130 to expose the through vias 112 and the die connectors 126. The planarization process may also grind the dielectric material 128. Top surfaces of the through vias 112, die connectors 126, dielectric material 128, and encapsulant 130 are coplanar after the planarization process. The planarization process may be, for example, a chemical-mechanical polish (CMP), a grinding process, or the like. In some embodiments, the planarization may be omitted, for example, if the through vias 112 and die connectors 126 are already exposed.

In FIGS. 7 through 15, a front-side redistribution structure 132 is formed. As will be illustrated, the front-side redistribution structure 132 includes dielectric layers 134, 140, 146, 152, and 158, and also includes metallization patterns 138, 144, and 150. The metallization patterns may also be referred to as redistribution layers or redistribution lines, and include conductive vias and conductive lines (not separately labeled).

Figure 7:
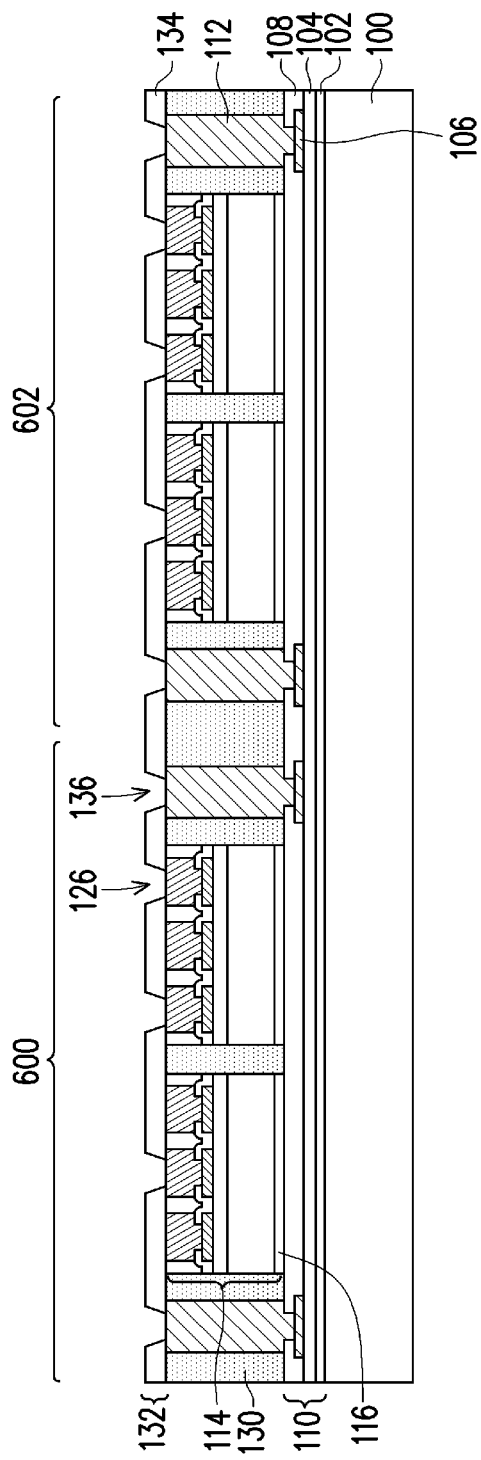

In FIG. 7, the dielectric layer 134 is deposited on the encapsulant 130, through vias 112, and die connectors 126. In some embodiments, the dielectric layer 134 is formed of a polymer, which may be a photo-sensitive material such as PBO, polyimide, BCB, or the like, that may be patterned using a lithography mask. In other embodiments, the dielectric layer 134 is formed of a nitride such as silicon nitride; an oxide such as silicon oxide, PSG, BSG, BPSG; or the like. The dielectric layer 134 may be formed by spin coating, lamination, CVD, the like, or a combination thereof.

The dielectric layer 134 is then patterned. The patterning forms openings 136 to expose portions of the through vias 112 and the die connectors 126. The patterning may be by an acceptable process, such as by exposing the dielectric layer 134 to light when the dielectric layer 134 is a photo-sensitive material or by etching using, for example, an anisotropic etch. If the dielectric layer 134 is a photo-sensitive material, the dielectric layer 134 can be developed after the exposure.

Figure 8:
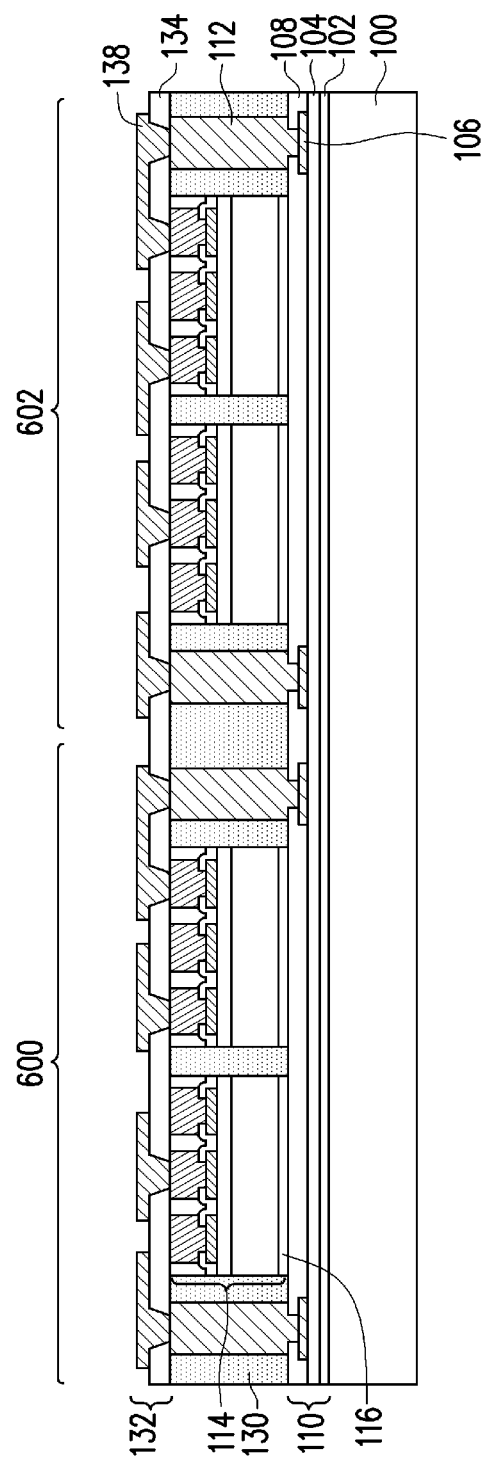

In FIG. 8, the metallization pattern 138 with vias is formed on the dielectric layer 134. As an example to form the metallization pattern 138, a seed layer (not shown) is formed over the dielectric layer 134 and in the openings 136 through the dielectric layer 134. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 138. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 138 and vias. The vias are formed in openings 136 through the dielectric layer 134 to, e.g., the through vias 112 and/or the die connectors 126.

Figure 9:
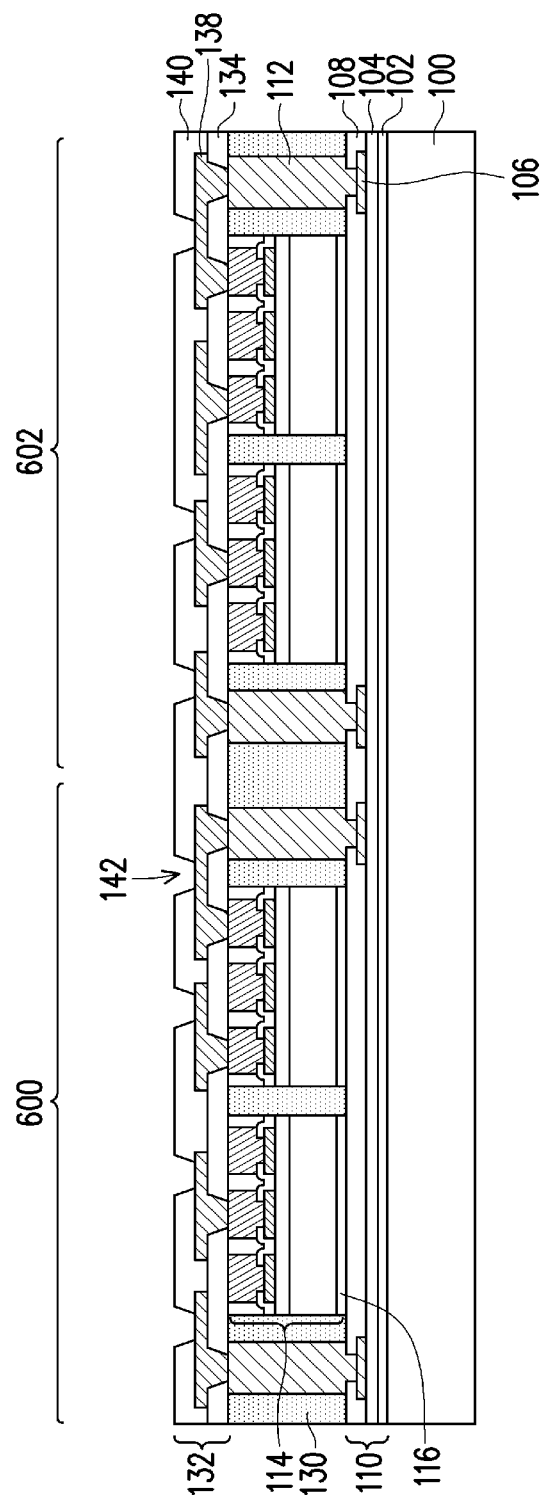

In FIG. 9, the dielectric layer 140 is deposited on the metallization pattern 138 and the dielectric layer 134. In some embodiments, the dielectric layer 140 is formed of a polymer, which may be a photo-sensitive material such as PBO, polyimide, BCB, or the like, that may be patterned using a lithography mask. In other embodiments, the dielectric layer 140 is formed of a nitride such as silicon nitride; an oxide such as silicon oxide, PSG, BSG, BPSG; or the like. The dielectric layer 140 may be formed by spin coating, lamination, CVD, the like, or a combination thereof.

The dielectric layer 140 is then patterned. The patterning forms openings 142 to expose portions of the metallization pattern 138. The patterning may be by an acceptable process, such as by exposing the dielectric layer 140 to light when the dielectric layer 140 is a photo-sensitive material or by etching using, for example, an anisotropic etch. If the dielectric layer 140 is a photo-sensitive material, the dielectric layer 140 can be developed after the exposure.

Figure 10:
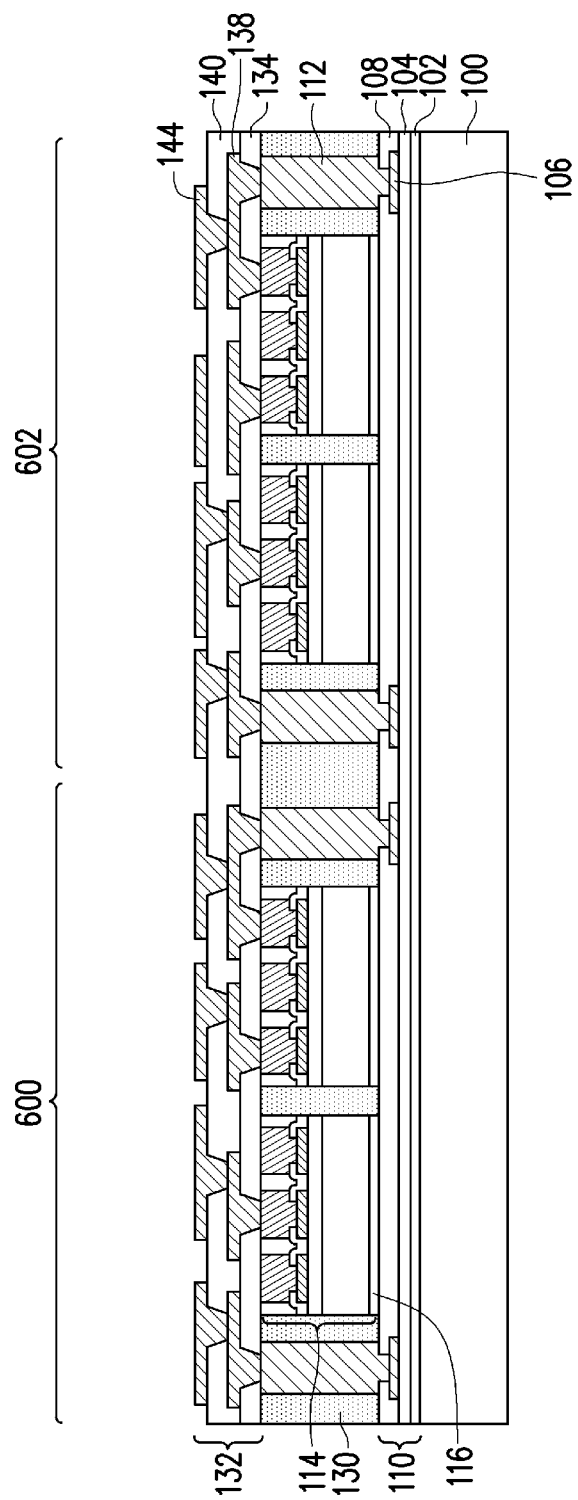

In FIG. 10, the metallization pattern 144 with vias is formed on the dielectric layer 140. As an example to form the metallization pattern 144, a seed layer (not shown) is formed over the dielectric layer 140 and in the openings 142 through the dielectric layer 140. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 144. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comp rise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 144 and vias. The vias are formed in the openings 142 through the dielectric layer 140 to, e.g., portions of the metallization pattern 138.

Figure 11:
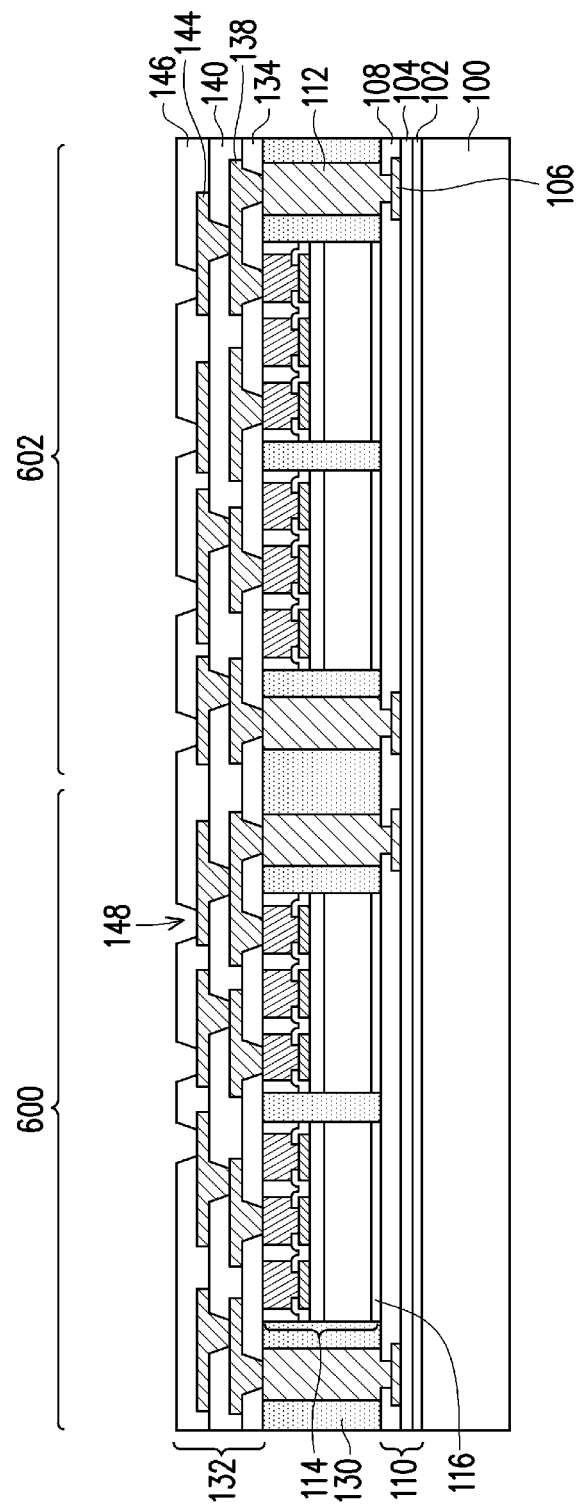

In FIG. 11, the dielectric layer 146 is deposited on the metallization pattern 144 and the dielectric layer 140. In some embodiments, the dielectric layer 146 is formed of a polymer, which may be a photo-sensitive material such as PBO, polyimide, BCB, or the like, that may be patterned using a lithography mask. In other embodiments, the dielectric layer 146 is formed of a nitride such as silicon nitride; an oxide such as silicon oxide, PSG, BSG, BPSG; or the like. The dielectric layer 146 may be formed by spin coating, lamination, CVD, the like, or a combination thereof.

The dielectric layer 146 is then patterned. The patterning forms openings 148 to expose portions of the metallization pattern 144. The patterning may be by an acceptable process, such as by exposing the dielectric layer 146 to light when the dielectric layer 146 is a photo-sensitive material or by etching using, for example, an anisotropic etch. If the dielectric layer 146 is a photo-sensitive material, the dielectric layer 146 can be developed after the exposure.

Figure 12:
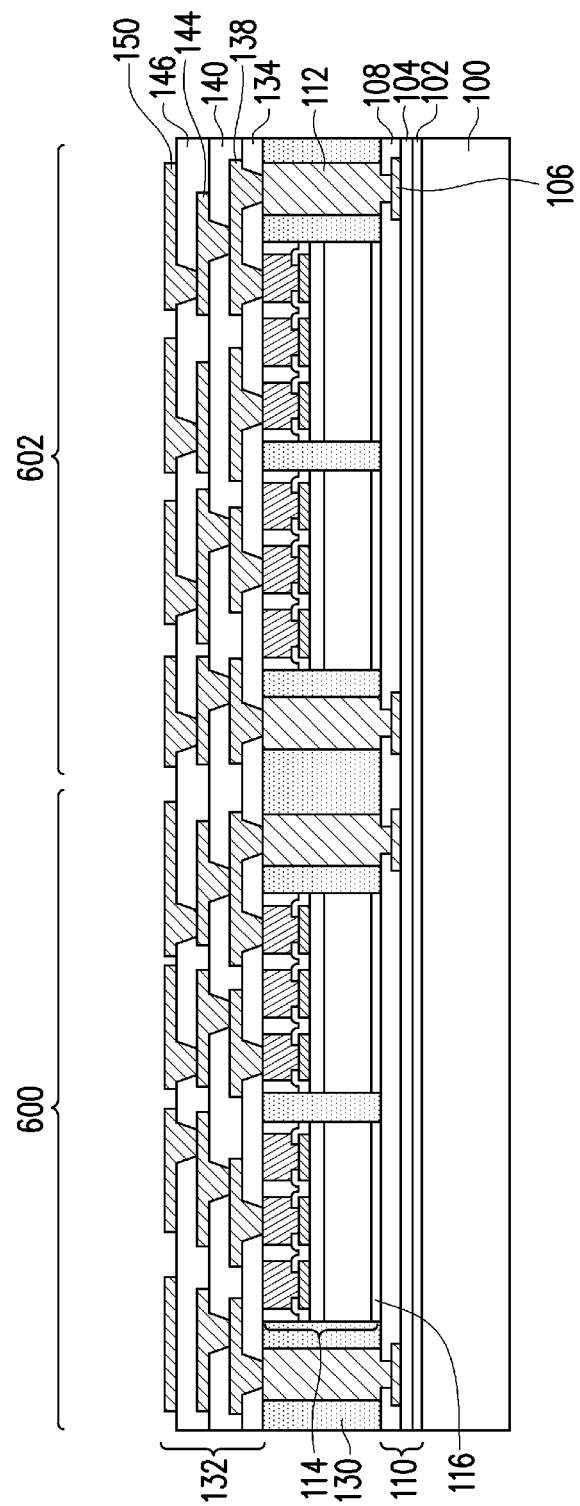

In FIG. 12, the metallization pattern 150 with vias is formed on the dielectric layer 146. As an example to form metallization pattern 150, a seed layer (not shown) is formed over the dielectric layer 146 and in the openings 148 through the dielectric layer 146. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern iso. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 150 and vias. The vias are formed in openings through the dielectric layer 146 to, e.g., portions of the metallization pattern 144.

Figure 13:
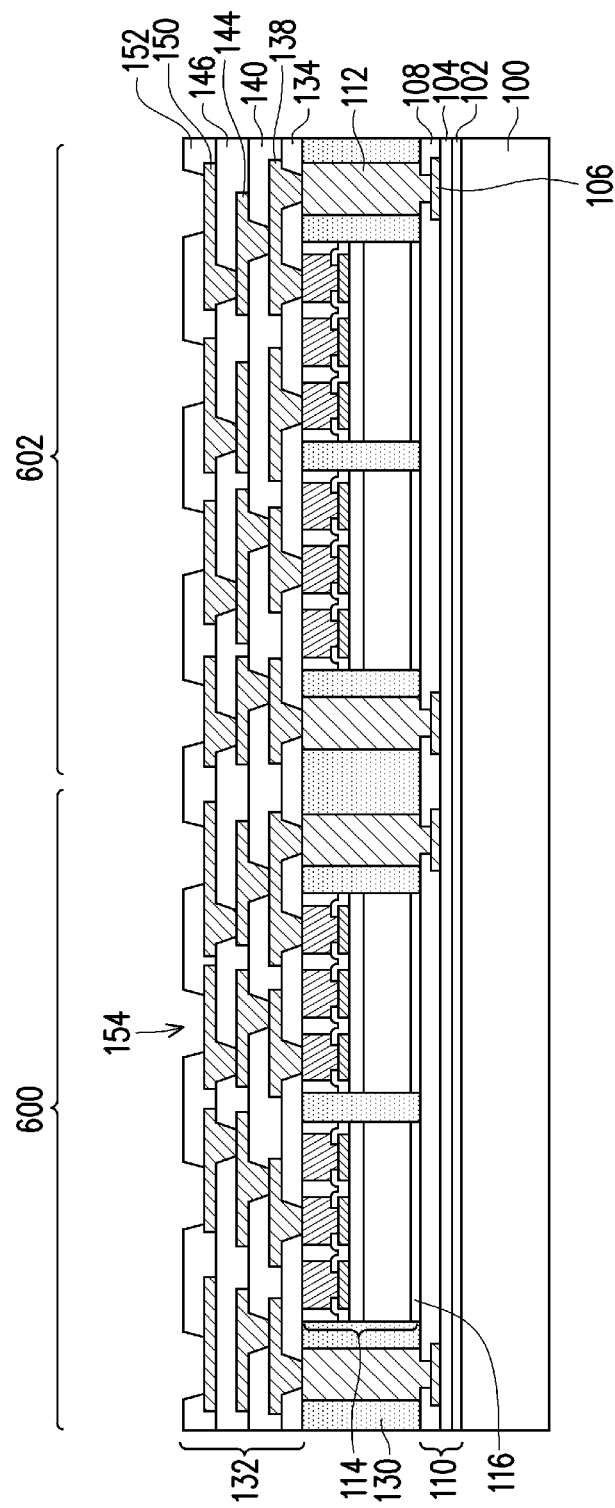

In FIG. 13, the dielectric layer 152 is deposited on the metallization pattern 150 and the dielectric layer 146. In some embodiments, the dielectric layer 152 is formed of a polymer, which may be a photo-sensitive material such as PBO, polyimide, BCB, or the like, that may be patterned using a lithography mask. In other embodiments, the dielectric layer 152 is formed of a nitride such as silicon nitride; an oxide such as silicon oxide, PSG, BSG, BPSG; or the like. The dielectric layer 152 may be formed by spin coating, lamination, CVD, the like, or a combination thereof.

The dielectric layer 152 is then patterned. The patterning forms openings 154 to expose portions of the metallization pattern 150. The patterning may be by an acceptable process, such as by exposing the dielectric layer 152 to light when the dielectric layer 152 is a photo-sensitive material or by etching using, for example, an anisotropic etch. If the dielectric layer 152 is a photo-sensitive material, the dielectric layer 152 can be developed after the exposure. The openings 154 may be wider than the openings 136, 142, 148.

Figure 14:
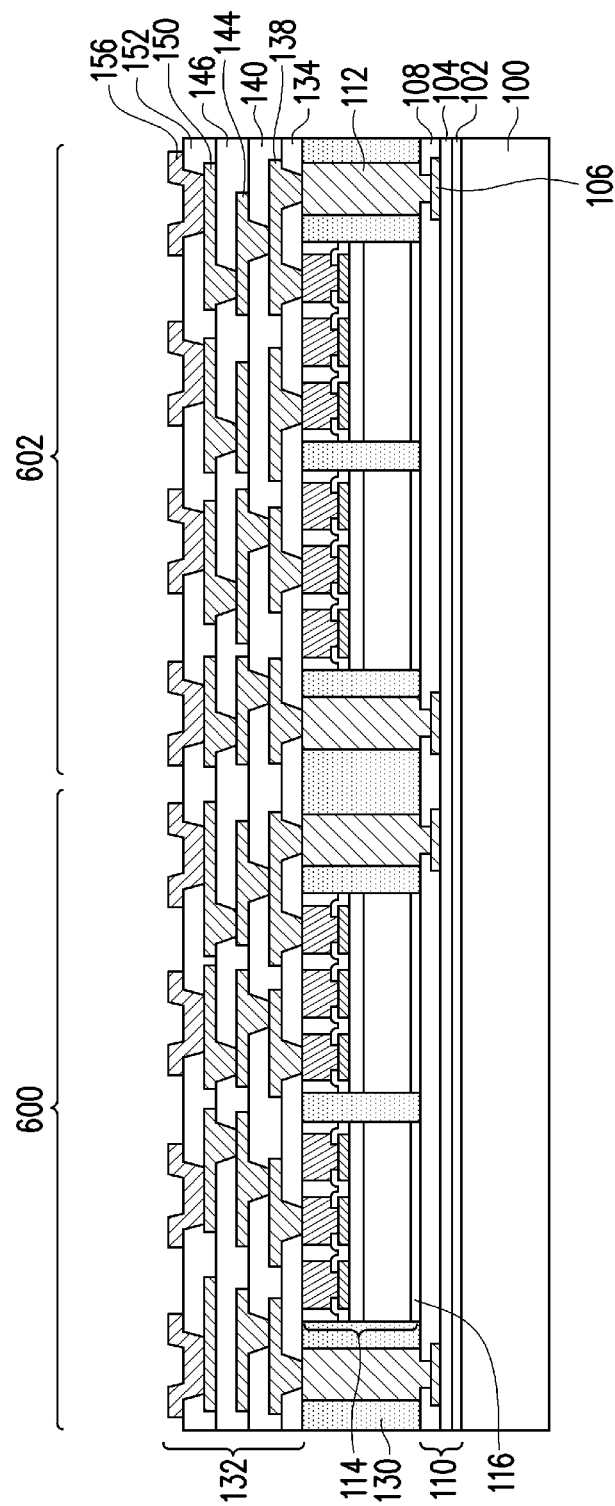

In FIG. 14, UBMs 156 are formed on the dielectric layer 152. In the illustrated embodiment, the UBMs 156 are formed through the openings 154 through the dielectric layer 152 to the metallization pattern 150. As an example to form the UBMs 156, a seed layer (not shown) is formed over the dielectric layer 152. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the UBMs 156. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal such as silver, gold, aluminum, palladium, nickel, nickel alloys, tungsten alloys, chromium, chromium alloys, the like, or combinations thereof, and may be multilayer conductive features. In an embodiment, the UBMs 156 include a nickel layer, a gold layer, and a palladium layer, and are formed by an electroless nickel-electroless palladium-immersion gold technique (ENEPIG) process. Once the conductive material is formed, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the UBMs 156. In embodiments where the UBMs 156 are formed differently, more photo resist and patterning steps may be utilized.

Figure 15:
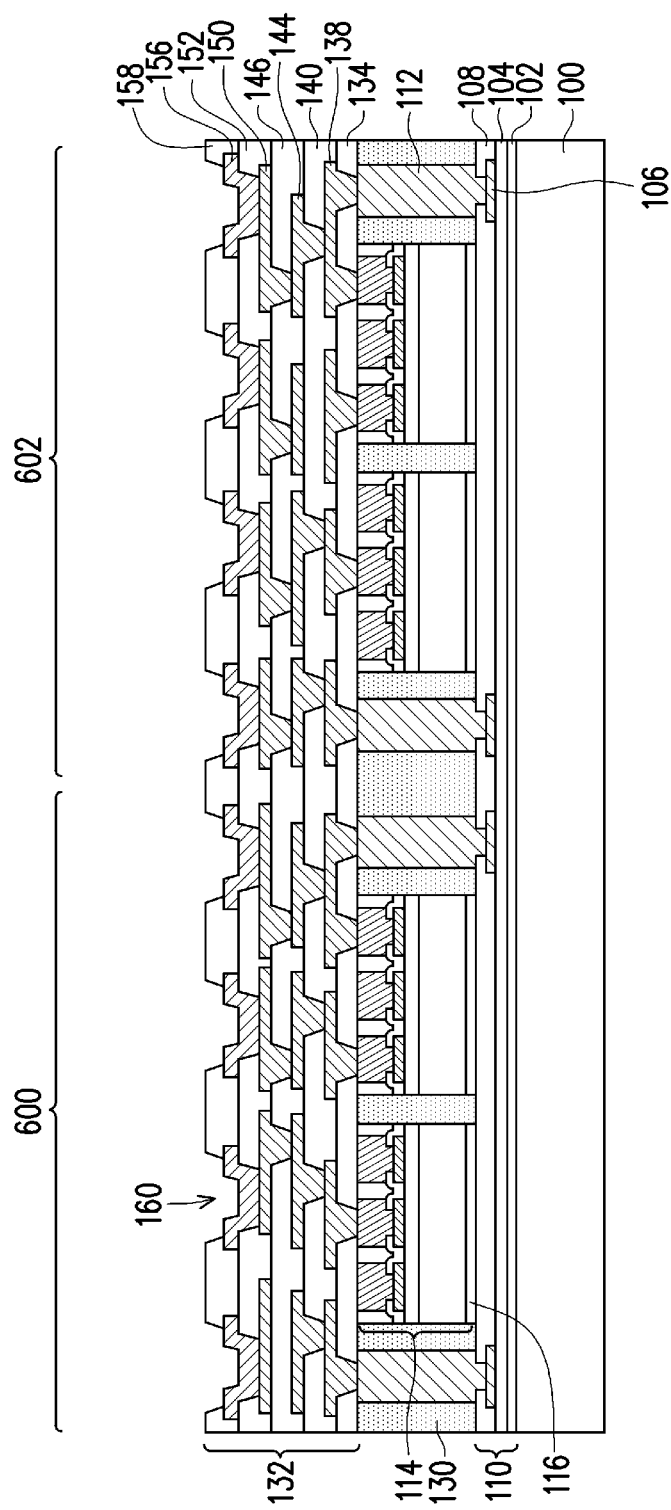

In FIG. 15, the dielectric layer 158 is deposited on the UBMs 156 and the dielectric layer 146. In some embodiments, the dielectric layer 158 is formed of a polymer, which may be a photo-sensitive material such as PBO, polyimide, BCB, or the like, that may be patterned using a lithography mask. In other embodiments, the dielectric layer 158 is formed of a nitride such as silicon nitride; an oxide such as silicon oxide, PSG, BSG, BPSG; or the like. The dielectric layer 158 may be formed by spin coating, lamination, CVD, the like, or a combination thereof.

The dielectric layer 158 is then patterned. The patterning forms openings 160 to expose portions of the UBMs 156. The patterning may be by an acceptable process, such as by exposing the dielectric layer 158 to light when the dielectric layer 158 is a photo-sensitive material or by etching using, for example, an anisotropic etch. If the dielectric layer 158 is a photo-sensitive material, the dielectric layer 158 can be developed after the exposure.

The front-side redistribution structure 132 is shown as an example. More or fewer dielectric layers and metallization patterns may be formed in the front-side redistribution structure 132. If fewer dielectric layers and metallization patterns are to be formed, steps and processes discussed above may be omitted. If more dielectric layers and metallization patterns are to be formed, steps and processes discussed above may be repeated. One having ordinary skill in the art will readily understand which steps and processes would be omitted or repeated.

Figure 16:
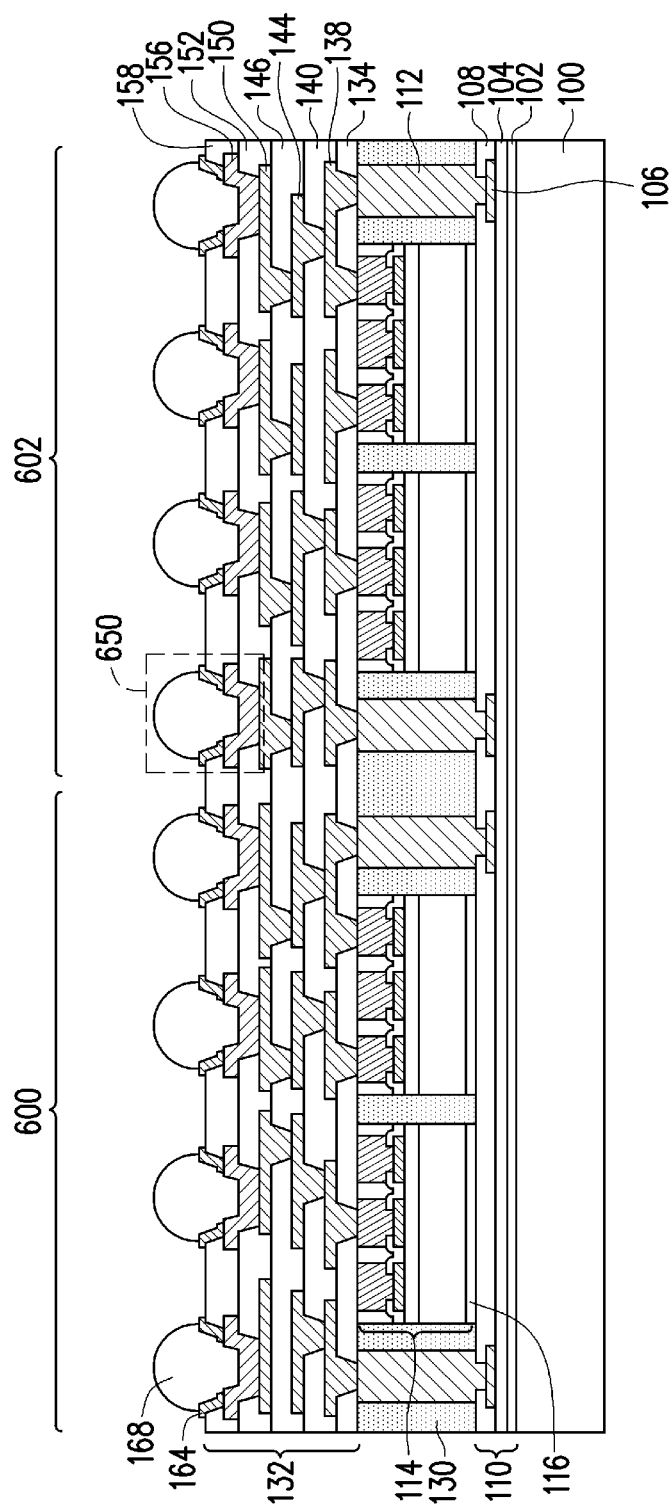
Figure 17A:
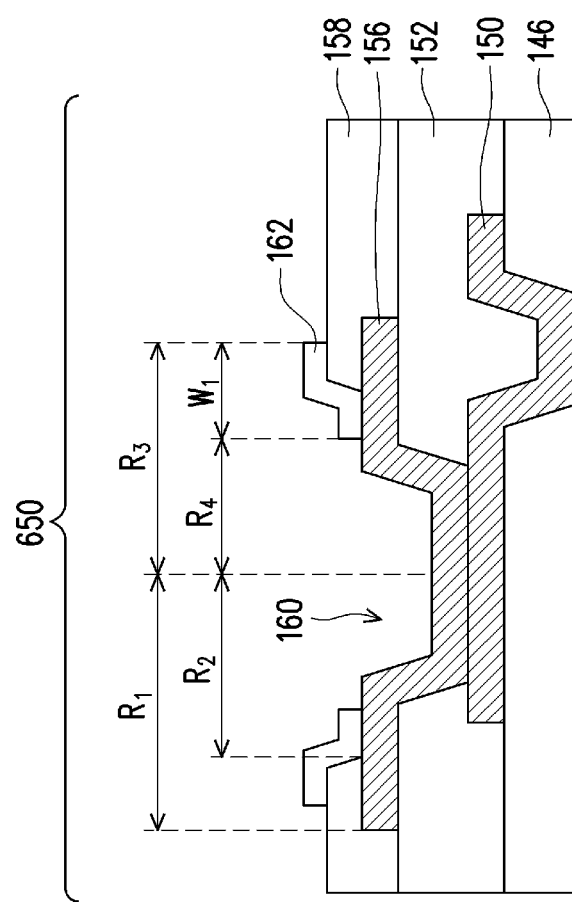
Figure 17B:
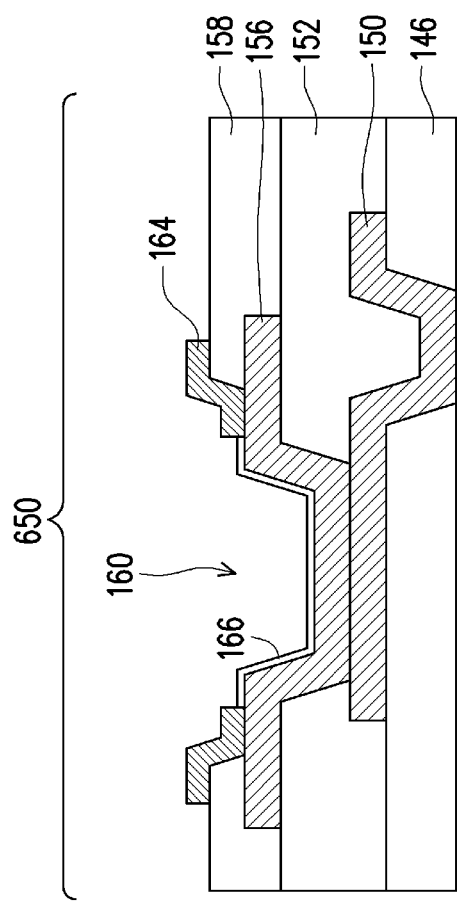
Figure 17C:
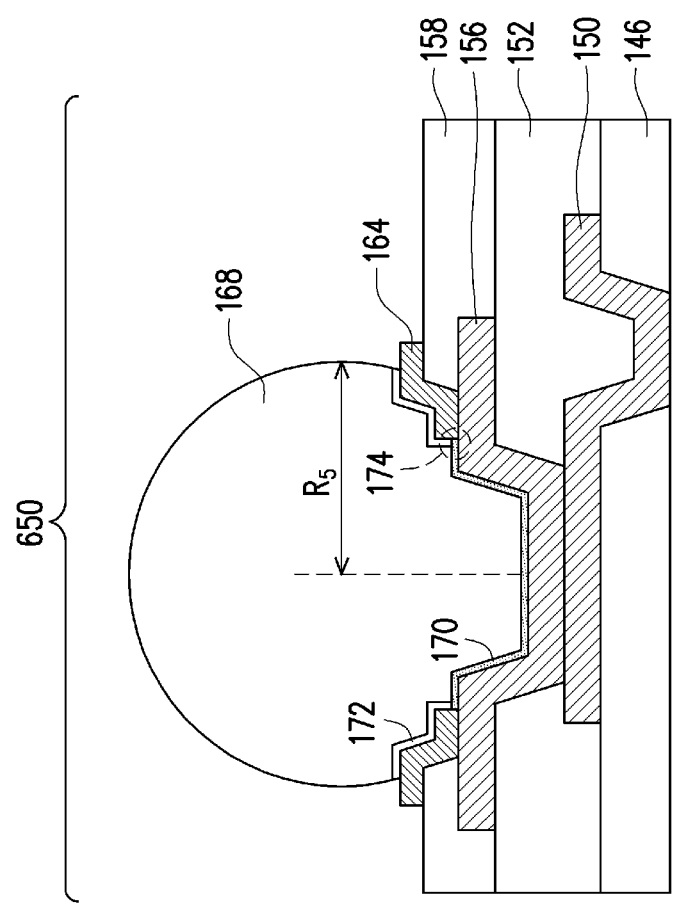
Figure 18:
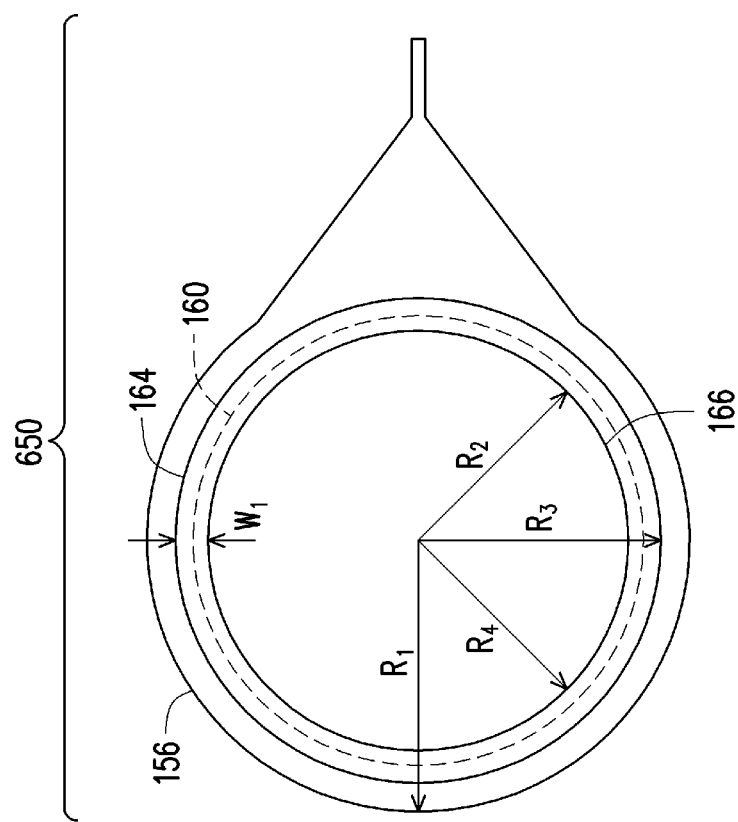

In FIGS. 16, a conductive ring 164 is formed on the UBMs 156, around the perimeter of the openings 160. Further, conductive connectors 168 are formed on the UBMs 156, in the openings 160. FIGS. 17A through 17C are cross-sectional views illustrating more details of a region 650 during a process for forming the conductive ring 164 and conductive connectors 168, and FIG. 18 is a top-down view illustrating more details of the region 650 after formation of the conductive ring 164. FIGS. 16, 17A, 17B, 17C, and 18 are described in conjunction with one another.

In FIG. 17A, a conductive paste 162 is formed on the UBMs 156. The conductive paste 162 may be, e.g., a copper paste, a solder paste, a silver paste, or the like, and may be dispensed by, e.g., a printing process or the like. In embodiments where a printing process is used, an image with the desired pattern of the conductive paste 162 is printed on the UBMs 156 using a stencil. The conductive paste 162 is formed as an annulus or ring around the perimeter of the openings 160, sealing the interface of the UBMs 156 and dielectric layer 158. The conductive paste 162 extends along a top surface of the dielectric layer 158, sides of the dielectric layer 158 defining the openings 160, and portions of the UBMs 156.

After formation, the conductive paste 162 is cured to harden it, thereby forming the conductive ring 164. The conductive ring 164 may be cured by an annealing process performed at a temperate of from about 100° C. to about 200° C., such as about 150° C., and for a time of from about 30 minutes to about 2 hours.

The UBMs 156 are formed having a radius $R_1$ of from about 100 μm to about 250 μm. The openings 160 are formed having a radius $R_2$ of from about 70 μm to about 220 μm. The radius $R_1$ of the UBMs 156 is greater than the radius $R_2$ of the openings 160. The conductive ring 164 has an annular shape, with an outer radius $R_3$ of from about 100 VIM to about 250 μm and an inner radius $R_4$ of from about 50 μm to about 200 μm. The different radii are related according to: $R_1 > R_3 > R_2 > R_4$.

The conductive ring 164 is formed to a width $W_1$. The width $W_1$ is the difference between the outer radius $R_3$ and inner radius $R_4$ of the conductive ring 164. In embodiments where the conductive ring 164 is copper paste formed by printing, the width $W_1$ is from about 30 μm to about 50 μm. Printing techniques for copper paste may have up to 30 μm of inaccuracy. As such, a width $W_1$ of at least 30 μm may ensure the interfaces of the dielectric layer 158 and UBMs 156 are completely sealed by the conductive ring 164, notwithstanding printing errors or shifts. Further, increasing the exposed surface area of the UBMs 156 allows the material of the conductive connectors 168 to more easily spread during reflow. As such, a width $W_1$ of up to 50 μm may ensure that sufficient surface area of the UBMs 156 is exposed.

In FIG. 17B, the UBMs 156 are coated with a flux 166. The flux 166 may be, e.g., a no-clean flux. The flux 166 may be applied to the surfaces of the UBMs 156 by, e.g., a jetting process, and may be formed to a thickness of from about 25 μm to about 50 μm. The conductive ring 164 acts as a barrier, preventing the flux 166 from reacting at the interfaces of the UBMs 156 and dielectric layer 158. The flux 166 is formed within the boundaries of the inner radius of the conductive ring 164.

In FIG. 17C, the conductive connectors 168 are formed in the openings 160 and on the UBMs 156 (e.g., flux 166). Each conductive connector 168 extends completely through the middle of a conductive ring 164. The conductive connectors 168 may be BGA connectors, solder balls, metal pillars, controlled collapse chip connection ($C_4$) bumps, micro bumps, ENEPIG-formed bumps, or the like. The conductive connectors 168 may include a conductive material such as solder, copper, aluminum, gold, nickel, silver, palladium, tin, the like, or a combination thereof. In some embodiments, the conductive connectors 168 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 168 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillars. The metal cap layer may include nickel, tin, tin-lead, gold, silver, palladium, indium, nickel-palladium-gold, nickel-gold, the like, or a combination thereof and may be formed by a plating process. After formation, the conductive connectors 168 have a radius $R_5$. In an embodiment, the radius $R_5$ of the conductive connectors 168 is greater than the inner radius $R_4$ of the conductive ring 164.

During reflow, the flux 166 may be consumed, and the conductive connectors 168 wet to the conductive ring 164 and UBMs 156. Further, the materials of the conductive ring 164 and UBMs 156 form an intermetallic compound (IMC) 170 during reflow. The IMC 170 may conform to the shape of the underlying UBMs 156. The materials of the conductive connectors 168 and conductive ring 164 also form an IMC 172 during reflow. The IMC 172 may conform to the shape of the underlying conductive ring 164. Because the UBMs 156 and conductive ring 164 are different materials, the IMCs 170 and 172 are different compounds. Further, although the conductive connectors 168 and IMCs 170 and 172 are illustrated as having distinguishable interfaces, it should be appreciated that the various conductive materials may intermingle during reflow. As such, an IMC (not shown) may form at the interface 174 of the conductive connectors 168 and IMCs 170 and 172 that includes conductive materials from the conductive connectors 16, conductive ring 164, and UBMs 156.

Also during reflow of the conductive connectors 168, the conductive ring 164 acts as a barrier, preventing the flux 166 from flowing between the UBMs 156 and dielectric layer 158. Oxides (e.g., Cu oxide) may form at the interface of the UBMs 156 and dielectric layer 158, acting as an adhesion layer. The flux 166 may wash away the adhesion layer, and preventing the flux 166 from flowing into the interface may improve adhesion between the UBMs 156 and dielectric layer 158, thereby reducing the chances of delamination at the interface. Delamination of the UBMs 156 and dielectric layer 158 may result in reflowable material entering the interface, which may cause cracking of the dielectric layers. By reducing delamination at the interface, the mechanical reliability of the front-side redistribution structure 132 may be improved.

FIG. 18 is a top-down view illustrating more details of the region 650 after formation of the conductive ring 164 and before formation of the conductive connectors 168. In other words, FIG. 18 is a top-down view of the intermediate step shown in FIG. 17B.

Figure 19:
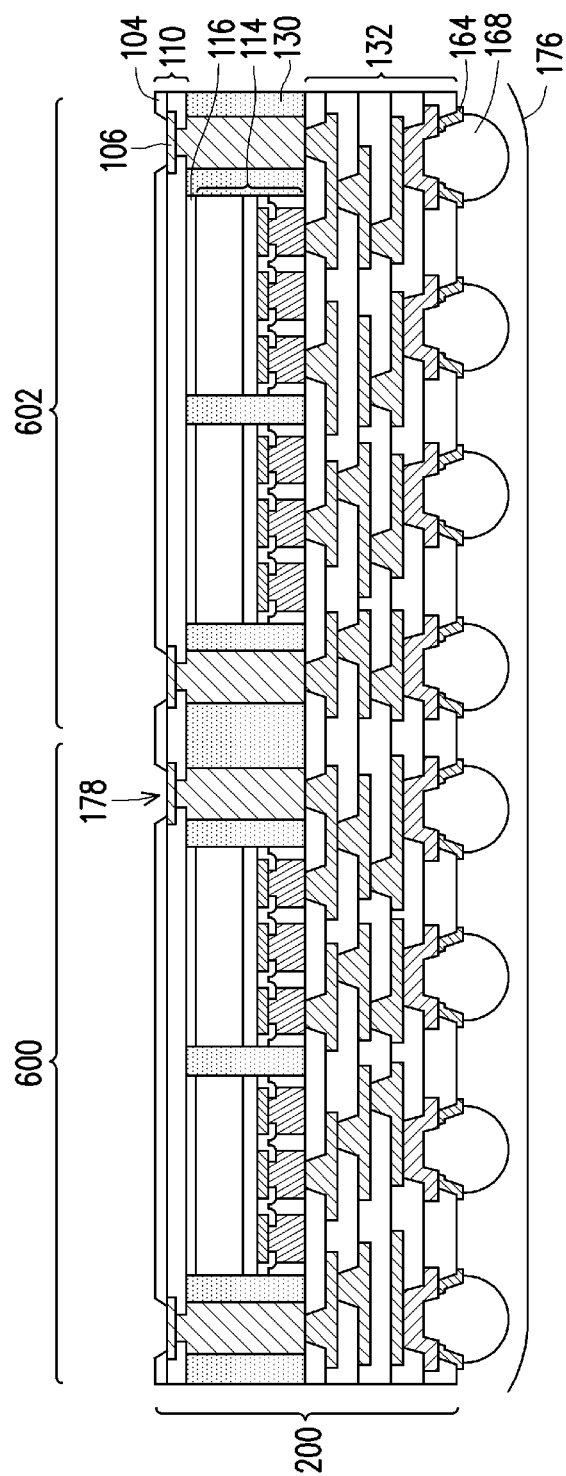

In FIG. 19, a carrier substrate de-bonding is performed to detach (de-bond) the carrier substrate 100 from the backside redistribution structure no, e.g., the dielectric layer 104. The first packages 200 are thereby formed in each of the first package region 600 and the second package region 602. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on a tape 176. Further, openings 178 are formed through the dielectric layer 104 to expose portions of the metallization pattern 106. The openings 178 may be formed, for example, using laser drilling, etching, or the like.

Figure 20:
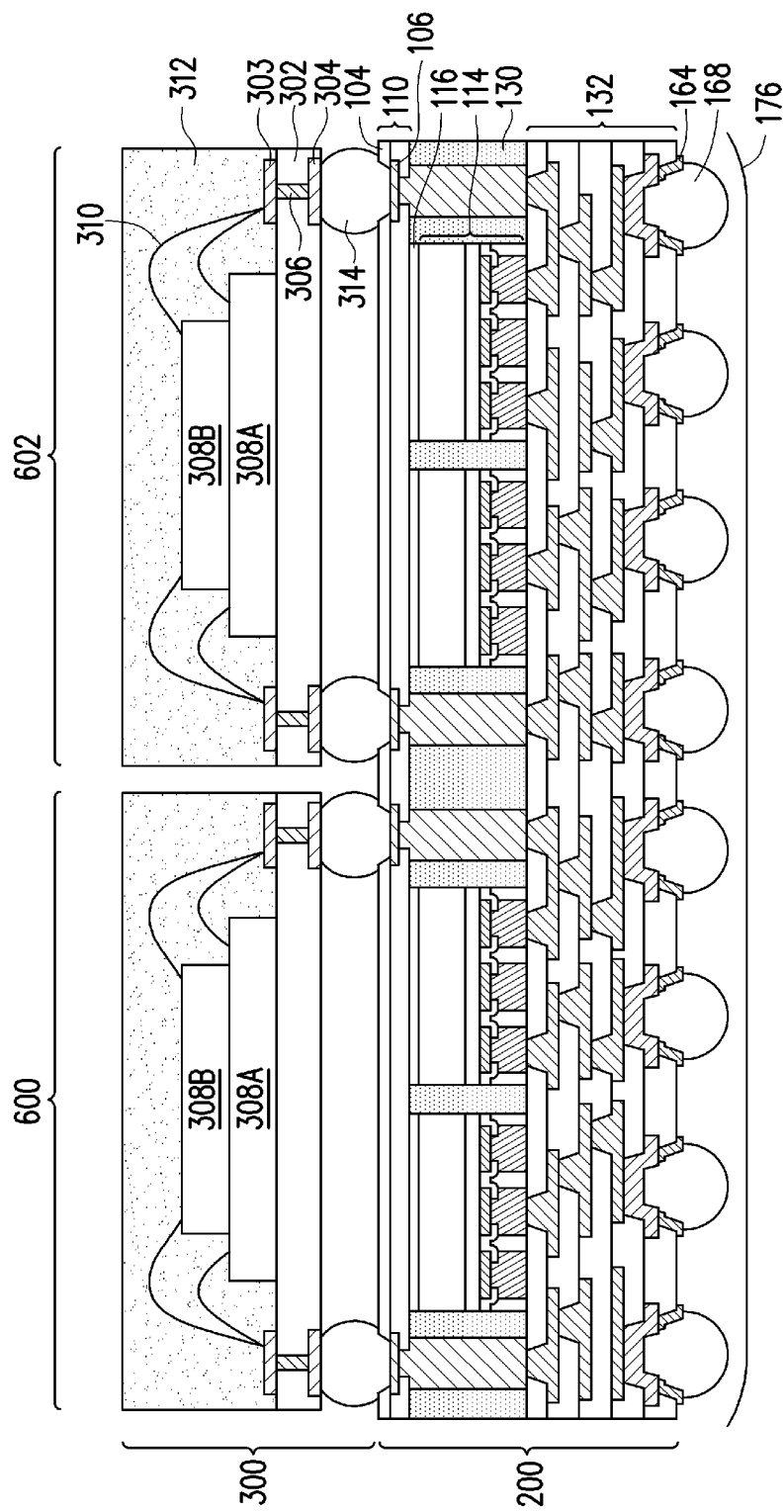
FIGS. 20 through 21 illustrate cross-sectional views of intermediate steps during a process for forming a package structure, in accordance with some embodiments.
Figure 21:
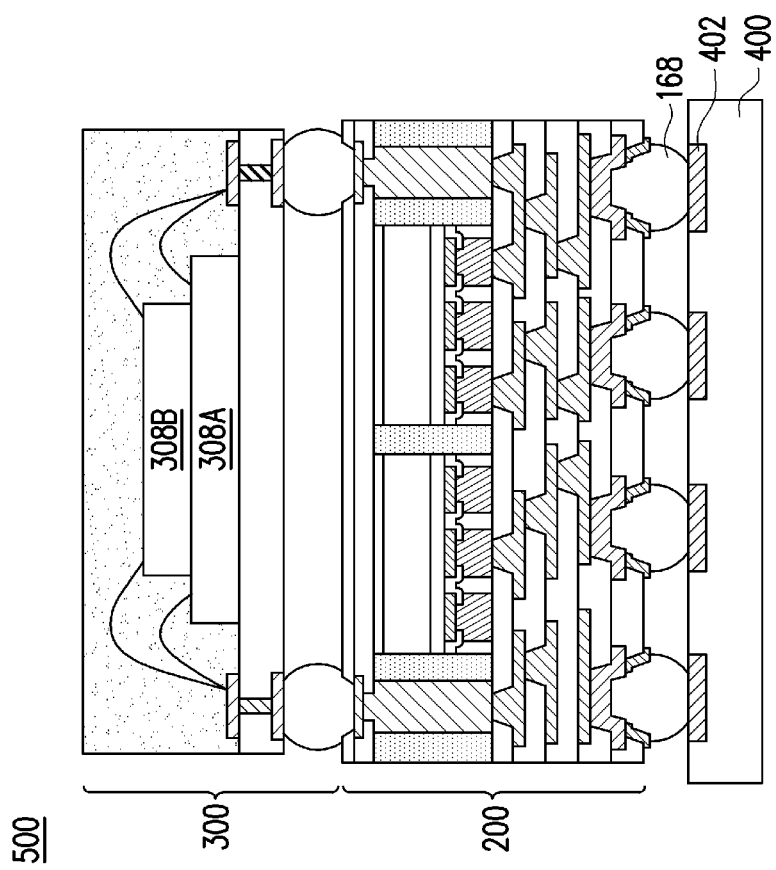

FIGS. 20 through 21 illustrate cross-sectional views of intermediate steps during a process for forming a package structure 500, in accordance with some embodiments. The package structure 500 may be referred to a package-on-package (PoP) structure.

In FIG. 20, a second package 300 is attached to the first package 200. The second package 300 includes a substrate 302 and one or more stacked dies 308 (308A and 308B) coupled to the substrate 302. Although a singular stack of dies 308 (308A and 308B) is illustrated, in other embodiments, a plurality of stacked dies 308 (each having one or more stacked dies) may be disposed side by side coupled to a same surface of the substrate 302. The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a silicon-on-insulator (SOI) substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 302.

The substrate 302 may include active and passive devices (not shown). As one of ordinary skill in the art will recognize, a wide variety of devices such as transistors, capacitors, resistors, combinations of these, and the like may be used to generate the structural and functional requirements of the design for the second package 300. The devices may be formed using any suitable methods.

The substrate 302 may also include metallization layers (not shown) and through vias 306. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrate 302 may have bond pads 303 on a first side the substrate 202 to couple to the stacked dies 308, and bond pads 304 on a second side of the substrate 302, the second side being opposite the first side of the substrate 302, to couple to the conductive connectors 314. In some embodiments, the bond pads 303 and 304 are formed by forming recesses (not shown) into dielectric layers (not shown) on the first and second sides of the substrate 302. The recesses may be formed to allow the bond pads 303 and 304 to be embedded into the dielectric layers. In other embodiments, the recesses are omitted as the bond pads 303 and 304 may be formed on the dielectric layer. In some embodiments, the bond pads 303 and 304 include a thin seed layer (not shown) made of copper, titanium, nickel, gold, palladium, the like, or a combination thereof. The conductive material of the bond pads 303 and 304 may be deposited over the thin seed layer. The conductive material may be formed by an electrochemical plating process, an electroless plating process, CVD, ALD, PVD, the like, or a combination thereof. In an embodiment, the conductive material of the bond pads 303 and 304 is copper, tungsten, aluminum, silver, gold, the like, or a combination thereof.

In an embodiment, the bond pads 303 and 304 are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the bond pads 303 and 304. Any suitable materials or layers of material that may be used for the bond pads 303 and 304 are fully intended to be included within the scope of the current application. In some embodiments, the through vias 306 extend through the substrate 302 and couple at least one bond pad 303 to at least one bond pad 304.

In the illustrated embodiment, the stacked dies 308 are coupled to the substrate 302 by wire bonds 310, although other connections may be used, such as conductive bumps. In an embodiment, the stacked dies 308 are stacked memory dies. For example, the stacked dies 308 may be memory dies such as low-power (LP) double data rate (DDR) memory modules, such as LPDDR1, LPDDR2, LPDDR3, LPDDR4, or the like memory modules.

The stacked dies 308 and the wire bonds 310 may be encapsulated by a molding material 312. The molding material 312 may be molded on the stacked dies 308 and the wire bonds 310, for example, using compression molding. In some embodiments, the molding material 312 is a molding compound, a polymer, an epoxy, silicon oxide filler material, the like, or a combination thereof. A curing process may be performed to cure the molding material 312; the curing process may be a thermal curing, a UV curing, the like, or a combination thereof.

In some embodiments, the stacked dies 308 and the wire bonds 310 are buried in the molding material 312, and after the curing of the molding material 312, a planarization step, such as a grinding, is performed to remove excess portions of the molding material 312 and provide a substantially planar surface for the second package 300.

After the second package 300 is formed, the second package 300 is mechanically and electrically bonded to the first package 200 by way of conductive connectors 314, the bond pads 304, and the metallization pattern 106. In some embodiments, the stacked dies 308 may be coupled to the integrated circuit dies 114 through the wire bonds 310, the bond pads 303 and 304, through vias 306, the conductive connectors 314, and the through vias 112.

The conductive connectors 314 may be similar to the conductive connectors 168 described above and the description is not repeated herein, although the conductive connectors 314 and the conductive connectors 168 need not be the same. The conductive connectors 314 may be disposed on an opposing side of the substrate 302 as the stacked dies 308, in the openings 178. In some embodiments, a solder resist 318 may also be formed on the side of the substrate 302 opposing the stacked dies 308. The conductive connectors 314 may be disposed in openings in the solder resist 318 to be electrically and mechanically coupled to conductive features (e.g., the bond pads 304) in the substrate 302. The solder resist 318 may be used to protect areas of the substrate 302 from external damage.

In some embodiments, before bonding the conductive connectors 314, the conductive connectors 314 are coated with a flux (not shown), such as a no-clean flux. The conductive connectors 314 may be dipped in the flux or the flux may be jetted onto the conductive connectors 314. In another embodiment, the flux may be applied to the surfaces of the metallization pattern 106.

In some embodiments, the conductive connectors 314 may have an optional epoxy flux (not shown) formed thereon before they are reflowed with at least some of the epoxy portion of the epoxy flux remaining after the second package 300 is attached to the first package 200.

An underfill (not shown) may be formed between the first package 200 and the second package 300 and surrounding the conductive connectors 314. The underfill may reduce stress and protect the joints resulting from the reflowing of the conductive connectors 314. The underfill may be formed by a capillary flow process after the first package 200 is attached or may be formed by a suitable deposition method before the first package 200 is attached. In embodiments where the epoxy flux is formed, it may act as the underfill.

The bonding between the second package 300 and the first package 200 may be a solder bonding. In an embodiment, the second package 300 is bonded to the first package 200 by a reflow process. During this reflow process, the conductive connectors 314 are in contact with the bond pads 304 and the metallization pattern 106 to physically and electrically couple the second package 300 to the first package 200. After the bonding process, an intermetallic compound (IMC, not shown) may form at the interface of the metallization pattern 106 and the conductive connectors 314 and also at the interface between the conductive connectors 314 and the bond pads 304 (not shown).

A singulation process is performed by sawing along scribe line regions, e.g., between the first package region 600 and the second package region 602. The sawing singulates the first package region 600 from the second package region 602. The resulting, singulated first and second packages 200 and 300 are from one of the first package region 600 or the second package region 602. In some embodiments, the singulation process is performed after the second package 300 is attached to the first package 200. In other embodiments (not shown), the singulation process is performed before the second package 300 is attached to the first package 200, such as after the carrier substrate 100 is de-bonded and the openings 178 are formed.

In FIG. 21, the first package 200 is mounted to a package substrate 400 using the conductive connectors 168. The package substrate 400 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 400 may be a SOI substrate. Generally, an SOI substrate includes a layer of a semiconductor material such as epitaxial silicon, germanium, silicon germanium, SOI, SGOI, or combinations thereof. The package substrate 400 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 400.

The package substrate 400 may include active and passive devices (not shown). As one of ordinary skill in the art will recognize, a wide variety of devices such as transistors, capacitors, resistors, combinations of these, and the like may be used to generate the structural and functional requirements of the design for the package structure 500. The devices may be formed using any suitable methods.

The package substrate 400 may also include metallization layers and vias (not shown) and bond pads 402 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 400 is substantially free of active and passive devices.

In some embodiments, the conductive connectors 168 are reflowed to attach the first package 200 to the bond pads 402. The conductive connectors 168 electrically and/or physically couple the package substrate 400, including metallization layers in the package substrate 400, to the first package 200. In some embodiments, passive devices (e.g., surface mount devices (SMDs), not illustrated) may be attached to the first package 200 (e.g., bonded to the bond pads 402) prior to mounting on the package substrate 400. In such embodiments, the passive devices may be bonded to a same surface of the first package 200 as the conductive connectors 168.

The conductive connectors 168 may have an epoxy flux (not shown) formed thereon before they are reflowed with at least some of the epoxy portion of the epoxy flux remaining after the first package 200 is attached to the package substrate 400. This remaining epoxy portion may act as an underfill to reduce stress and protect the joints resulting from the reflowing the conductive connectors 168. In some embodiments, an underfill (not shown) may be formed between the first package 200 and the package substrate 400 and surrounding the conductive connectors 168. The underfill may be formed by a capillary flow process after the first package 200 is attached or may be formed by a suitable deposition method before the first package 200 is attached.

Embodiments may achieve advantages. Sealing the interface of the UBMs 156 and dielectric layer 158 with the conductive ring 164 may help prevent delamination of the interface, increasing the mechanical reliability of the front-side redistribution structure 132. Forming the conductive ring 164 to a width $W_1$ of from about 30 μm to about 50 μm may allow sufficient contact area between the UBMs 156 and conductive connectors 168 while allowing for use of a printing formation process.

In an embodiment, a device includes: an integrated circuit die; a first dielectric layer over the integrated circuit die; a first metallization pattern extending through the first dielectric layer to electrically connect to the integrated circuit die; a second dielectric layer over the first metallization pattern; an under bump metallurgy extending through the second dielectric layer; a third dielectric layer over the second dielectric layer and portions of the under bump metallurgy; a conductive ring sealing an interface of the third dielectric layer and the under bump metallurgy; and a conductive connector extending through the center of the conductive ring, the conductive connector electrically connected to the under bump metallurgy.

In an embodiment, the device further includes: flux on the under bump metallurgy, the flux adjoining an inner sidewall of the conductive ring, the conductive connector being on the flux. In an embodiment of the device, the conductive ring separates the conductive connector from the first dielectric layer. In an embodiment of the device, the under bump metallurgy extends through an opening in the second dielectric layer, the under bump metallurgy having a first radius, the opening having a second radius less than the first radius. In an embodiment of the device, the conductive ring is around the opening, the conductive ring having an annular shape with an outer radius and an inner radius, a difference between the outer radius and the inner radius being from 30 μm to 50 μm. In an embodiment of the device, the first radius of the under bump metallurgy is greater than the outer radius of the conductive ring. In an embodiment of the device, the second radius of the opening is greater than the inner radius of the conductive ring and less than the outer radius of the conductive ring. In an embodiment of the device, the first radius of the under bump metallurgy is greater than the second radius of the opening. In an embodiment of the device, the conductive ring extends along top surfaces of the third dielectric layer and the under bump metallurgy. In an embodiment of the device, the conductive ring and the under bump metallurgy include different conductive materials.

In an embodiment, a device includes: an integrated circuit die; a through via adjacent the integrated circuit die; an encapsulant around the through via and the integrated circuit die; and a redistribution structure including: a first metallization pattern on a first dielectric layer, the first dielectric layer disposed on the encapsulant, the first metallization pattern extending through the first dielectric layer to electrically connect to the through via; an under bump metallurgy on a second dielectric layer, the second dielectric layer disposed on the first dielectric layer, the under bump metallurgy extending through the second dielectric layer to electrically connect to the first metallization pattern; and a conductive ring on a third dielectric layer, the third dielectric layer disposed on the second dielectric layer, the conductive ring sealing an interface of the third dielectric layer and the under bump metallurgy.

In an embodiment, the device further includes: conductive connectors on the under bump metallurgy and the conductive ring, the conductive ring separating the conductive connectors from the third dielectric layer. In an embodiment, the device further includes: a substrate electrically and physically connected to the redistribution structure by the conductive connectors. In an embodiment of the device, the conductive ring extends through the third dielectric layer, from top surface of the third dielectric layer to a top surface of the under bump metallurgy.

In an embodiment, a method includes: depositing a first dielectric layer disposed over an integrated circuit die; forming a first metallization pattern extending along the first dielectric layer; depositing a second dielectric layer over the first metallization pattern and the first dielectric layer; forming an under bump metallurgy extending along the second dielectric layer; depositing a third dielectric layer over the under bump metallurgy and the second dielectric layer; forming an opening in the third dielectric layer exposing the under bump metallurgy; dispensing a conductive paste at an interface of the third dielectric layer and the under bump metallurgy; and curing the conductive paste to form a conductive ring sealing the interface of the third dielectric layer and the under bump metallurgy.

In an embodiment of the method, the conductive paste is solder paste. In an embodiment of the method, the curing the conductive paste includes: annealing the solder paste at a temperature of from about 100° C. to about 200° C. for a time period of from 30 minutes to 2 hours. In an embodiment, the method further includes: coating exposed portions of the under bump metallurgy with flux, the conductive ring separating the flux from sides of the third dielectric layer defining the opening; and placing a conductive connector on the flux and the conductive ring. In an embodiment, the method further includes: reflowing the conductive connector to form a first intermetallic compound (IMC) and a second IMC, the first IMC formed at an interface of the conductive connector and the under bump metallurgy, the second IMC formed at an interface of the conductive ring and the under bump metallurgy. In an embodiment of the method, the dispensing the conductive paste at the interface includes: printing the conductive paste on the under bump metallurgy, on sides of the third dielectric layer defining the opening, and on top portions of the third dielectric layer proximate the sides.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
depositing a first dielectric layer on a substrate;
forming a first opening in the first dielectric layer;
forming an under-bump metallurgy in the first opening;
depositing a second dielectric layer on the under-bump metallurgy and the first dielectric layer;
forming a second opening in the second dielectric layer;
dispensing solder paste in the second opening, the solder paste dispensed at an interface of the second dielectric layer and the under-bump metallurgy;
curing the solder paste to form a conductive ring sealing the interface of the second dielectric layer and the under-bump metallurgy; and
after curing the solder paste, forming a conductive connector extending through a center of the conductive ring, the conductive connector disposed on the conductive ring and the under-bump metallurgy.

2. The method of claim 1, wherein the curing the solder paste comprises:
annealing the solder paste at a temperature of from about 100° C. to about 200° C., and for a time period of from about 30 minutes to about 2 hours.

3. The method of claim 1, further comprising:
coating exposed portions of the under-bump metallurgy with flux, the conductive ring separating the flux from sides of the second dielectric layer defining the second opening.

4. The method of claim 1, further comprising:
reflowing the conductive connector to form a first intermetallic compound and a second intermetallic compound, the first intermetallic compound formed at a first interface of the conductive connector and the under-bump metallurgy, the second intermetallic compound formed at a second interface of the conductive connector and the conductive ring, the first intermetallic compound and the second intermetallic compound being different compounds.

5. The method of claim 1, wherein the dispensing the solder paste in the second opening comprises:
printing the solder paste on the under-bump metallurgy, on sides of the second dielectric layer defining the second opening, and on top portions of the second dielectric layer proximate the sides of the second dielectric layer defining the second opening.

6. The method of claim 1, wherein after curing the solder paste, the conductive ring has an outer radius and an inner radius, and a difference between the outer radius and the inner radius is from about 30 μm to about 50 μm.

7. The method of claim 1, further comprising:
mounting the under-bump metallurgy to a package substrate with the conductive connector.

8. A method comprising:
forming an encapsulant around an integrated circuit die;
forming a redistribution structure on the encapsulant, the redistribution structure comprising an under-bump metallurgy and a dielectric layer, the under-bump metallurgy electrically coupled to the integrated circuit die, the dielectric layer disposed on the under-bump metallurgy, the under-bump metallurgy exposed by an opening in the dielectric layer;
dispensing a conductive paste on the under-bump metallurgy and around a perimeter of the opening in the dielectric layer;
curing the conductive paste to form a conductive ring comprising a first conductive material; and
forming a conductive connector extending through a center of the conductive ring, the conductive connector disposed on the under-bump metallurgy, the conductive connector comprising a second conductive material, the second conductive material being different than the first conductive material.

9. The method of claim 8, wherein the under-bump metallurgy has a first radius, the conductive ring has an inner radius and an outer radius, the inner radius is less than the outer radius, and the outer radius is less than the first radius.

10. The method of claim 9, wherein a difference between the outer radius and the inner radius is from about 30 μm to about 50 μm.

11. The method of claim 8, wherein dispensing the conductive paste comprises printing a copper paste, a solder paste, or a silver paste.

12. The method of claim 8, further comprising:
coating the under-bump metallurgy with flux, the conductive ring separating the flux from an interface of the dielectric layer and the under-bump metallurgy.

13. The method of claim 8, further comprising:
mounting the under-bump metallurgy to a package substrate by reflowing the conductive connector.

14. The method of claim 8, further comprising:
placing the integrated circuit die adjacent to a through via, the encapsulant formed around the through via.

15. A method comprising:
depositing a dielectric layer on an under-bump metallurgy, the under-bump metallurgy having a first radius;
patterning an opening in the dielectric layer to expose the under-bump metallurgy;
forming a conductive ring around a perimeter of the opening and on the under-bump metallurgy, the conductive ring having an inner radius and an outer radius, the inner radius being less than the outer radius, the outer radius being less than the first radius; and
forming a conductive connector through a center of the conductive ring, the conductive connector disposed on the under-bump metallurgy, the conductive connector having a second radius, the second radius being greater than the inner radius and less than the outer radius.

16. The method of claim 15, wherein forming the conductive ring comprises:
dispensing a conductive paste around the perimeter of the opening and on the under-bump metallurgy; and
curing the conductive paste.

17. The method of claim 15, further comprising:
mounting the under-bump metallurgy to a package substrate with the conductive connector.

18. The method of claim 15, further comprising:
forming a first intermetallic compound at a first interface of the conductive connector and the under-bump metallurgy; and
forming a second intermetallic compound at a second interface of the conductive connector and the conductive ring, the first intermetallic compound being different than the second intermetallic compound.

19. The method of claim 15, wherein a width of the conductive ring is from about 30 μm to about 50 μm.

20. The method of claim 15, wherein the conductive connector is formed after the conductive ring is formed.

\* \* \* \* \*